April 25, 1961

W. R. KOCH 2,981,895

SERIES ENERGIZED TRANSISTOR AMPLIFIER

Filed Nov. 29, 1954

INVENTOR.
Winfield R. Koch
BY
H. Olinston
ATTORNEY 2,981,895

SERIES ENERGIZED TRANSISTOR AMPLIFIER

Winfield R. Koch, Marlton, N.J., assignor to Radio Corporation of America, a corporation of Delaware Filed Nov. 29, 1954, Ser. No. 471,805
1 Claim. (Cl. 330—18)

The present invention relates generally to signal translating circuits and particularly to circuits of that type in which semiconductor devices or transistors are used.

In many applications of transistor circuits, it may be desirable to provide a signal output voltage which is larger than the maximum direct voltage rating of the transistor. This may, in certain cases, be accomplished by use of an output transformer having a voltage step-up ratio. In some cases, however, use of an output transformer is precluded by frequency response requirements or because direct-current coupling is preferred. High signal voltage capability in a signal translating circuit is a common requirement, as for example, for driving the grid of a kinescope used as the picture tube in a television receiver. Voltage regulator and filter circuit applications in which transistors are used also often require that a high voltage be placed across the transistor output circuit.

Accordingly, it is an object of the present invention, to provide an improved signal translating circuit wherein semiconductor devices are used effectively to provide a high voltage output signal.

It is another object of the present invention, to provide a signal translating circuit which utilizes a plurality of semiconductor devices effectively to multiply the signal output voltage capability thereof.

It is a further object of the present invention, to provide an improved signal amplifier circuit in which transistors are used effectively and efficiently to provide a relatively high signal output voltage.

It is still a further object of the present invention, to provide a push-pull amplifier circuit wherein increased output voltage is obtained over that of conventional amplifier circuits.

These and further objects may be accomplished in one embodiment of the present invention by connecting the collector-to-emitter paths of a plurality of transistors in series. The direct energizing voltage which may be applied to the series combination is then greater than the voltage which may be applied between the collector and emitter electrodes of a single transistor by the number of transistors connected in series, provided that the direct energizing voltage may be divided essentially equally across each of the transistors. If, for example, two transistors are connected in series, as by connecting the emitter electrode of the first to the collector electrode of the second, the voltage applied to the series combination may be double that applied to each individual transistor provided that the direct current energizing voltage is divided substantially equally across the two transistors.

This is accomplished in the latter case by connecting a potential divider circuit between the collector electrode of the first of the two transistors and ground and connecting the base electrode of that transistor to a tap point which is at a potential half way between the potential of the collector electrode and ground potential. The emitter electrode of the second of the two transistors is also connected to ground and a signal input circuit is coupled with the base electrode of the second transistor. Output signals may then be derived from the collector electrode of the first transistor in response to input signals applied to the base electrode of the second transistor.

Since the direct voltage applied between the collector electrode of the first transistor and the emitter electrode of the second transistor is substantially double that which may be applied to each of the transistors alone, the output signal voltage may have an amplitude double that obtainable from one of the transistors acting alone. Amplified signal currents flowing in the collector electrode circuit of the second transistor provide input signals for the emitter electrode of the first transistor, thereby causing further amplification of the signal. More than two transistors may be employed by utilizing an appropriate divider ratio connected with the base electrode of the first transistor and inserting additional transistors in series between the aforementioned two transistors. The base electrodes of the additional transistors may then be connected to points of appropriate potential on a divider network to provide equal voltage drops between the collector and emitter electrodes of each of the transistors.

Direct voltage may be applied between the collector electrode of the first transistor and the emitter electrode of the second transistor by means of a source of energizing potential and a load resistor connected in series therebetween. Alternatively, a series combination of transistors of one conductivity type may be combined with another series of transistors of opposite conductivity type to provide push-pull operation in which direct energizing voltage may be applied across the two combinations in series. Output voltage may then be derived from the junction between the two combinations.

The novel features that are considered characteristic of this invention are set forth with particularity in the appended claim. The invention itself, however, both as to its organization and method of operation as well as additional objects and advantages thereof, will be best understood from the following description when read in connection with the accompanying drawing in which:

Figure 1:
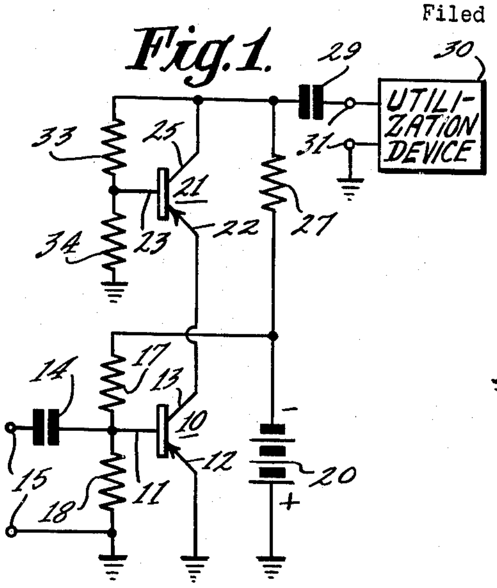
Figure 1 is a schematic circuit diagram of an amplifier circuit utilizing a pair of transistors in accordance with one embodiment of the present invention.

Referring now to the drawing, wherein like elements are designated by like reference numerals throughout the various figures, and referring particularly to Figure 1, a transistor 10 has a base electrode 11 coupled through a coupling capacitor 14 to one of a pair of input terminals 15, the other of which is connected to ground. An emitter electrode 12 of the transistor 10 is grounded. Bias for the base electrode 11 may be obtained by any of several conventional methods and is shown in the circuit of Figure 1 to be obtained by connecting a potential divider consisting of the series combination of a bias resistor 17 and a shunt resistor 18 across a source of energizing potential illustrated as a battery 20, and connecting the junction of these resistors to the base electrode 11.

A series path through the two transistors is established by connecting the collector electrode 13 of the transistor 10 to the emitter electrode 22 of the transistor 21. The collector electrode 25 of the transistor 21 is connected through a load impedance element illustrated as a resistor 27 to the battery 20, whereby energizing current from the battery 20 flows through the load resistor 27, the collector-emitter path of the transistor 21 and the collector-emitter path of the transistor 10 in series. An output circuit may be coupled to the collector electrode 25 and is illustrated in the circuit of Figure 1 as a utilization device 30 connected to a pair of output terminals 31, one of which is grounded, and the other of which is connected through a coupling capacitor 29 to the collector electrode 25.

A potential divider circuit shown for illustrative purposes to consist of the series combination of a pair of resistors 33 and 34 is connected between the collector electrode 25 and ground. The base electrode 23 of the transistor 21 is connected to the junction of the resistor 33 and the resistor 34 and the divider circuit is adjusted to provide a direct voltage for the base electrode equal to half the voltage at the collector electrode 25. It is noted that reactive elements may be utilized in the divider circuit in order to effect equal voltage division at high signal frequencies. In particular, a capacitor may be connected in parallel relation with either of the resistors 33 and 34 of the divider circuit.

The voltage between the emitter electrode 22 and the base electrode 23 will be very small, so that the voltage between the collector electrode 25 and the emitter electrode 22 will be substantially equal to the voltage between the collector electrode 13 and the emitter electrode 12. Thus, the maximum voltage that may be applied between the collector electrode 25 and ground is approximately double the maximum voltage which may be applied between the collector and emitter electrodes of either transistor alone. The maximum output signal voltage is likewise approximately doubled.

A signal applied to the pair of input terminals 15 is coupled to the base electrode 11 and will cause signal current to flow in the collector electrode circuit of the transistor 10. This collector signal current provides signal excitation for the emitter electrode 22. The output signal voltage appearing between the collector electrode 25 and ground will be substantially higher than that appearing between the collector electrode 13 and ground because of the amplification provided by the transistor 25. An improvement in gain over that obtainable from a single transistor is thus realized with the use of this circuit, in addition to the high output voltage capability obtained.

Figure 2:
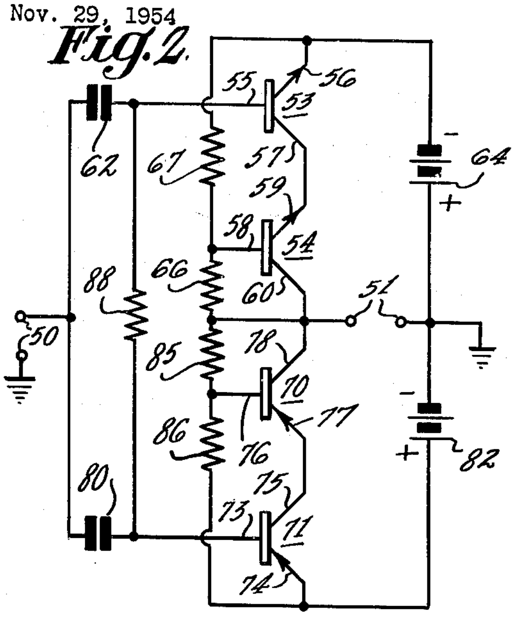
Figure 2 is a schematic circuit diagram of a push-pull amplifier circuit utilizing transistors of opposite conductivity type in another embodiment of the present invention.

In Figure 2, to which reference is now made, the principles of the present invention are advantageously utilized in a push-pull amplifier having two parallel signal translating paths between a pair of input terminals 50 and a pair of output terminals 51. One signal translating path includes a pair of transistors 53 and 54 connected in a circuit similar to that described with reference to Figure 1, in which the base electrode 55 of the transistor 53 is coupled to one of the pair of input terminals 50 through a coupling capacitor 62. The other of the pair of input terminals 50 is grounded. The emitter electrode 56 of the transistor 53 is connected to ground through a source of energizing potential illustrated as a battery 64. The collector electrode 57 of the transistor 53 is connected with the emitter electrode 59 of the transistor 54, the collector electrode of which is connected to one of the pair of output terminals 51. The other of the pair of output terminals 51 is connected to ground.

A voltage divider circuit consisting of the series combination of a pair of direct current conductive impedance elements illustrated as a pair of resistors 66 and 67 is connected between the collector electrode 60 and the emitter electrode 56. The junction of the resistor 66 and the resistor 67 is connected to the base electrode 58 of the transistor 54. The potential of this junction point determines the potential of the collector electrode 57 and the emitter electrode 59 and thus determines the division of voltage from the battery 64 between the transistor 53 and the transistor 54.

The other of the pair of parallel signal paths between the pair of input terminals 50 and the pair of output terminals 51 includes a pair of transistors 70 and 71 which are of a conductivity type opposite to that of the transistors 53 and 54. The ungrounded one of the pair of input terminals 50 is connected to a base electrode 73 of the transistor 71 through a coupling capacitor 80.

The emitter electrode 74 of the transistor 71 is connected to ground through a source of energizing potential illustrated as a battery 82. The collector electrode 75 of the transistor 71 is connected to the emitter electrode 77 of the transistor 70, the collector electrode of which is connected to the collector electrode 60. A voltage divider circuit consisting of the series combination of a pair of direct current conductive impedance elements illustrated as a pair of resistors 85 and 86 is connected between the collector electrode 78 and the emitter electrode 74. The junction of the resistor 85 and the resistor 86 is connected to the base electrode 76 of the transistor 70. Bias current for the transistor 53 and the transistor 71 may be obtained by any of several conventional methods and is shown for purposes of illustration to be derived by connecting the bias resistor 88 between the base electrode 55 and the base electrode 73.

Energizing current is thus caused to flow through the collector-emitter paths of all four transistors connected in series from the battery 64 and the battery 82 also connected in series. The load impedance element 27 of the circuit of Figure 1, to which reference is jointly made is thereby eliminated since one pair of transistors may be considered as a direct current load element for the other. The voltage appearing between the collector and emitter electrodes of each of the transistors may be equal by proper selection of the values of the voltage divider resistors 66, 67, 85 and 86 as shown in the description of the circuit of Figure 1. The circuit of Figure 2, however, operates in push-pull thereby obtaining the advantages of low second order harmonic generation and efficient operation. Class B as well as class A operation may be employed. Furthermore, relatively high power output may be obtained from this circuit by virtue of the greater number of transistors employed.

Figure 3:
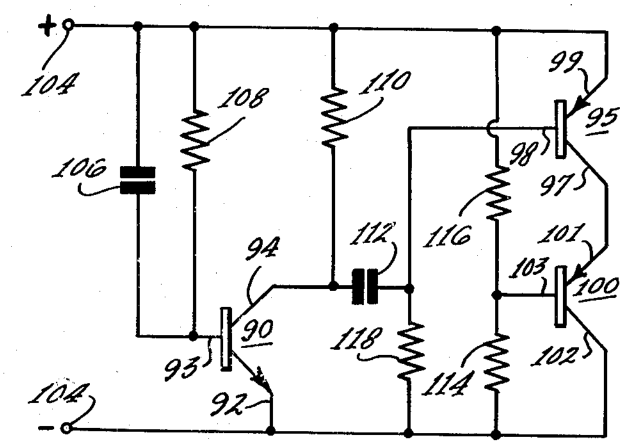
Figure 3 is a schematic circuit diagram of a two shunt terminal filter circuit incorporating a signal translating circuit in accordance with the present invention.

Reference is now made to Figure 3, wherein a two terminal shunt filter incorporating a signal translating circuit in accordance with the invention comprises an amplifier transistor 90 coupled in cascade relation with a pair of transistors 95 and 100 connected in a circuit similar to that of Figure 1, to which reference is jointly made. The transistors 95 and 100 are of conductivity type opposite to that of the amplifier transistor 90 thus, the transistor 90 may be considered to be an N-P-N transistor while the transistors 95 and 100 may be considered P-N-P type transistors. The circuit shown in Figure 3 may be utilized to remove ripple from a direct voltage source. The transistors are so connected that the ripple voltage to the terminals of the circuit is amplified and a current is fed back in such a manner that the ripple voltage is effectively cancelled.

The filter circuit embodying the invention includes a pair of input terminals 104 to which may be applied a direct current polarizing voltage as well as the unwanted alternating current components or ripple voltage. The circuit arrangement is such that the polarity of the polarizing voltage is proper for biasing each of the transistors in the conventional manner for normal transistor action. This is, each of the collectors will be biased in the relatively non-conducting or reverse direction with respect to their respective base electrodes, while each of the emitters will be biased in the relatively forward or conducting direction with respect to their respective base electrodes. Thus, for a transistor of P type conductivity (i.e., an N-P-N junction transistor) this means that the collector will be positive with respect to the base while the emitter will be negative with respect to the base. For a transistor of N type conductivity (i.e., a P-N-P junction transistor) on the other hand, the collector will be negative with respect to the base while the emitter will be positive with respect to the base.

Ripple voltage appearing across the pair of input terminals 104 is applied to the base electrode 93 of the transistor 90 by means of a coupling capacitor 106 connected between the positive one of the pair of input terminals 104 and the base electrode 93. A biasing resistor 108 shunts the coupling capacitor 106 and is connected for applying operating bias current to the base electrode 93. The emitter electrode 92 of the transistor 90 is returned directly to the negative one of a pair of input terminals 104. Ripple voltage is amplified by the transistor 90 and appears in amplified form at the collector 94 of the transistor 90 which derives its energizing current from the positive one of the pair of input terminals 104 through a load resistor 110. An alternating current signal path is provided between the collector electrode 94 and the base electrode 98 of the transistor 95 by means of a coupling capacitor 112 connected therebetween. The emitter electrode 99 of the transistor 96 is connected to the positive one of the pair of input terminals 104. The collector electrode 97 of the transistor 95 is directly connected to the emitter electrode 101 of the transistor 100 while the collector electrode 102 of the transistor 100 is returned to the negative one of the pair of input terminals 104. A voltage divider circuit consisting of the series combination of a resistor 114 and a resistor 116 is connected between the pair of input terminals 104. The junction between the resistor 114 and the resistor 116 is connected to the base electrode 103 of the transistor 100. The values of these resistances will be adjusted at their junction point approximately mid-way between the potential applied to the pair of input terminals 104. Thus, as in the case of Figure 1, the voltage appearing between the collector and emitter electrodes of the transistors 95 and 100 will be approximately equal. Bias current is supplied to the base electrode 98 of the transistor 95 through a bias resistor 118 connected between the base electrode 98 and the negative one of the pair of input terminals 104.

The amplified signal current flowing between the collector 94 and the base electrode 98 is opposite in phase to ripple current flowing into the base electrode 93. This amplified current is further amplified by the transistor 95 which will then draw a relatively heavy signal current from the pair of terminals 104. Since there is no phase reversal between the base electrode 98 and the emitter electrode 99, the current flowing in the emitter electrode 99 will tend to cancel ripple signals appearing at the pair of terminals 104. This signal current is in turn applied to the emitter electrode 101 of the transistor 100 from the collector electrode 97 of the transistor 95. By transistor action, the current in the collector electrode 102 of the transistor 100 is substantially identical to that flowing in the emitter electrode 101. Thus the series combination of the collector-to-emitter paths of the transistors 95 and 100 are seen to offer an extremely low impedance path for ripple currents between the pair of terminals 104, while the direct current resistance is quite high. Use of a pair of series connected transistors 95 and 100 in a shunt filter circuit as described, is thus seen effectively to double the direct current voltage to which this filter circuit may be applied. The direct current voltage may be further increased by use of a greater number of transistors having their collector-emitter paths connected in series relation, and having a voltage divider circuit connected with their base electrodes for dividing the voltage applied to each one equally.

The output voltage capability of a signal translating circuit in accordance with the present invention may be extended to any desired degree by use of a plurality of transistors having their collector-emitter paths connected in series. A method for accurately and reliably dividing the direct energizing voltage evenly among the transistors enables the full advantages of series operation to be enjoyed. Various applications of this principle may be envisioned so that signal translating circuits embodying the present invention should find widespread use wherever relatively high voltages are required in transistor signal translating circuits.

What is claimed is:

In a signal amplifier system, an input electronic signal amplifying device having an electrode connected to a point of reference potential, an input electrode and an output electrode; one or more other electronic signal amplifying devices connected to said input device in succession and each having an emitter electrode, a control electrode and an output electrode; means connecting the emitter electrode of each of said other devices to the output electrode of the preceding device; a source of operating voltage and a load impedance serially connected between the output electrode of the last device and said point of reference potential; and means for applying biasing potentials to the respective control electrodes of said other devices, said last means consisting of a voltage divider additional to and exclusive of said load impedance, a direct current conductive connection between one end of said voltage divider and said point of reference potential, a direct current conductive connection between the output electrode of the last device and the other end of said voltage divider, whereby the entire output signal voltage appears across said voltage divider, and direct current conductive connections between the control electrodes of said other devices and spaced points on said voltage divider, whereby each of the control electrodes of said other devices is caused to vary in potential in direct proportion to the variations in said output signal voltage according to its point of connection to said divider.

References Cited in the file of this patent

UNITED STATES PATENTS

| | | |
|---|---|---|
| 1,986,597 | Nyman | Jan. 1, 1935 |
| 2,310,342 | Artzt | Feb. 9, 1943 |
| 2,666,817 | Raisbeck et al. | Jan. 19, 1954 |
| 2,666,818 | Shockley | Jan. 19, 1954 |
| 2,666,819 | Raisbeck | Jan. 19, 1954 |
| 2,730,576 | Caruthers | Jan. 10, 1956 |
| 2,764,643 | Sulzer | Sept. 25, 1956 |
| 2,811,590 | Doremus | Oct. 29, 1957 |
| 2,926,307 | Ehret | Feb. 23, 1960 |

OTHER REFERENCES

Sziklai: "Transistor Circuits and Applications," Electronic Engineering, September 1953, pp. 359–360.

Shea: "Principles of Transistor Circuits," September 15, 1953, pp. 112–124.